United States Patent [19]
Kagami

[11] Patent Number: 6,009,035
[45] Date of Patent: Dec. 28, 1999

[54] SEMICONDUCTOR MEMORY DEVICE

[75] Inventor: Akiihiko Kagami, Tokyo, Japan

[73] Assignee: NEC Corporation, Tokyo, Japan

[21] Appl. No.: 09/064,504

[22] Filed: Apr. 23, 1998

[30] Foreign Application Priority Data

Apr. 24, 1997 [JP] Japan .................................. 9-107377

[51] Int. Cl.$^6$ ................................................ G11C 8/00
[52] U.S. Cl. ............................ 365/230.01; 365/230.03
[58] Field of Search ...................... 365/230.01, 230.03, 365/230.06, 200

[56] References Cited

U.S. PATENT DOCUMENTS

| | | | |
|---|---|---|---|
| 5,373,471 | 12/1994 | Saeki et al. | 365/230.09 |
| 5,761,148 | 6/1998 | Allan et al. | 365/230.06 |
| 5,777,927 | 7/1998 | Takahashi et al. | 365/230.03 |
| 5,798,973 | 8/1998 | Isa | 365/230.03 |
| 5,808,945 | 9/1998 | Arase | 365/200 |
| 5,862,086 | 1/1999 | Makimura et al. | 365/230.06 |

FOREIGN PATENT DOCUMENTS

63-8556 2/1988 Japan .

*Primary Examiner*—Huan Hoang
*Assistant Examiner*—Anh Phung
*Attorney, Agent, or Firm*—McGinn & Gibb, P.C.

[57] ABSTRACT

A main word driver, a main word driver for redundancy and a memory array are adjacent to each other and are arranged in a column or a row direction. Plural pairs of these are arranged in row and column directions and a block is constructed with plural memory arrays arranged in the column direction as a unit. A divisional driver control circuit is arranged in each column of each memory array. A sense amplifier is arranged between respective memory arrays in a row. A data amplifier is arranged with respect to each block. A main word signal for redundancy RMWL' as one output of the main word driver for redundancy within each block is also used as a block selecting signal showing selective activation in a block unit through a block selecting circuit BSL. Thus, it is possible to reduce a layout area of the semiconductor memory device in a divisional word driver system.

8 Claims, 6 Drawing Sheets

ered. For example, respective main
SEMICONDUCTOR MEMORY DEVICE

BACKGROUND OF THE INVENTION

1. Field of the Invention

The present invention relates to a semiconductor memory device, and particularly relates to a semiconductor memory device in which word driver circuits are respectively divided and arranged within plural memory arrays.

2. Prior Art

Conventionally, in the semiconductor memory device of this kind, a word driver for operating a word line of a memory cell array is constructed by connecting an output to a metallic wiring such as aluminum backed to reduce a time constant of poly-silicon wiring connected to a gate of a memory cell and is arranged at the same pitch as the poly-silicon wiring and the aluminum wiring. However, the fine structure of a pattern is advanced as the capacity of an LSI is increased. Therefore, it has become difficult to pattern aluminum, etc. at the pitch of the poly-silicon wiring connected to the gate of the memory cell. Further, a memory cell portion is raised and it is difficult to pattern aluminum, etc. by a step caused on a boundary of the raised memory cell portion. Therefore, a divisional word driver system easy to escape passage of the aluminum wiring of the memory cell portion begins to be adopted in recent years as one of these solving measures.

Figure 4:
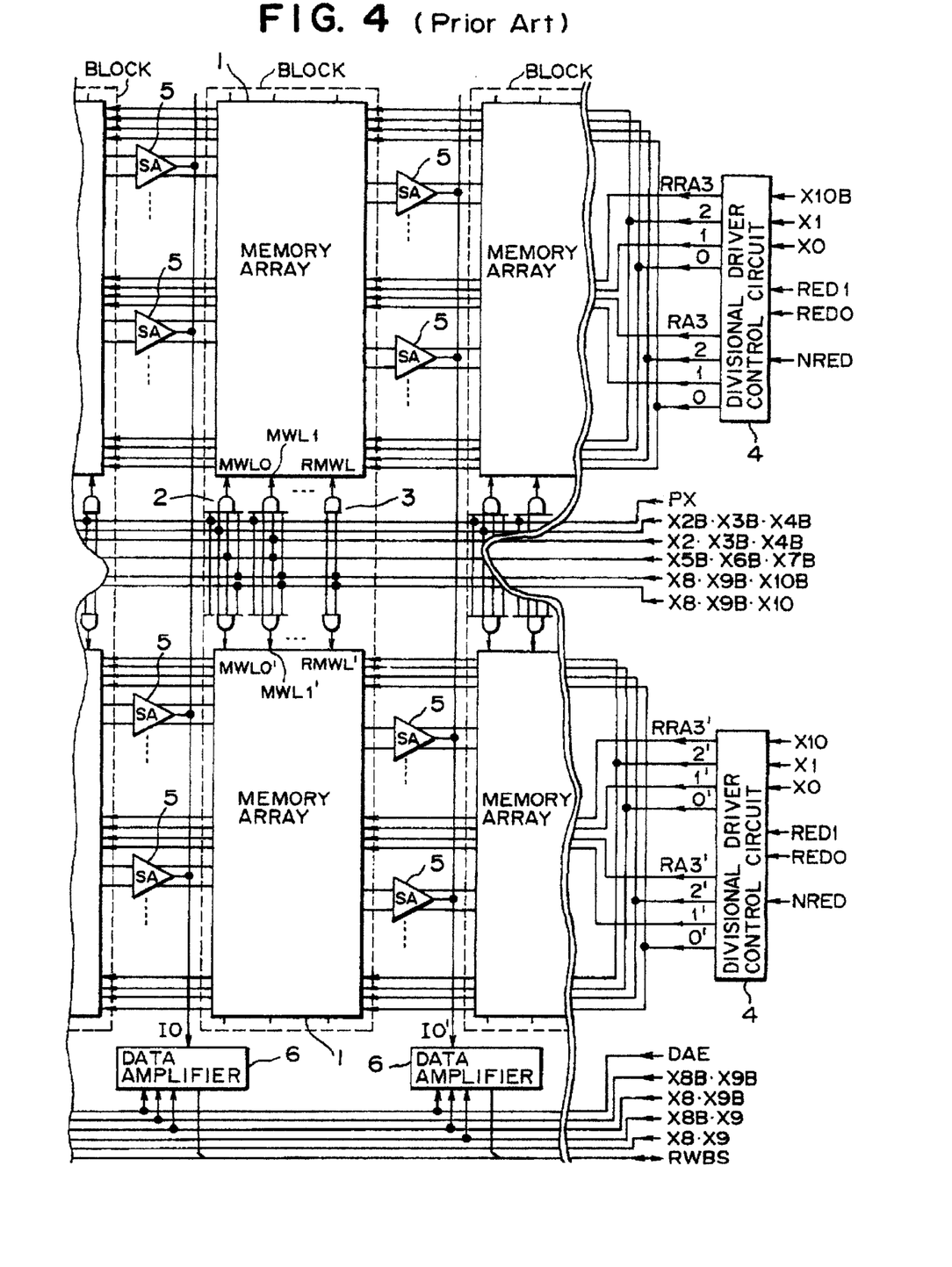
FIG. 4 is a partial block diagram showing a constructional example of a conventional semiconductor memory device.

FIG. 4 is a partial block diagram showing a constructional example of the conventional semiconductor memory device. With reference to FIG. 4, in this conventional semiconductor device, a main word driver 2, a main word driver for redundancy 3 and a memory array 1 are adjacent to each other and are arranged in a column direction. Plural pairs of these are arranged in row and column directions and a block is constructed with plural memory arrays arranged in the column direction as a unit. A divisional driver control circuit 4 is arranged in each column of each memory array 1. A sense amplifier 5 is arranged between respective columns of the memory arrays 1. A data amplifier 6 is arranged with respect to each block.

Figure 5:
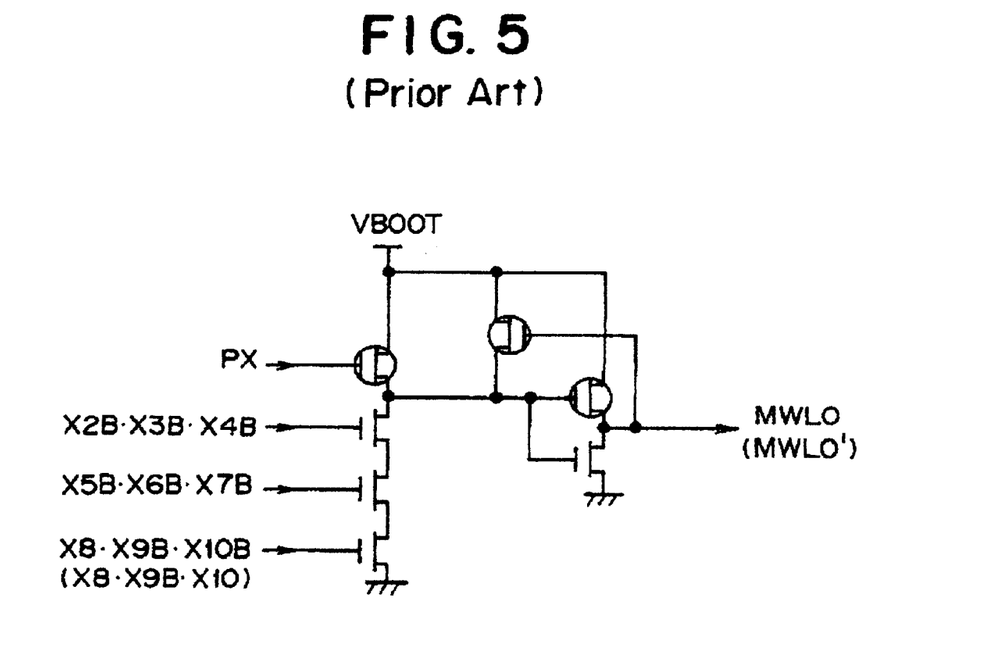
FIG. 5 is a circuit diagram showing a constructional example of a main word driver in the semiconductor memory device of FIG. 4.
Figure 6:
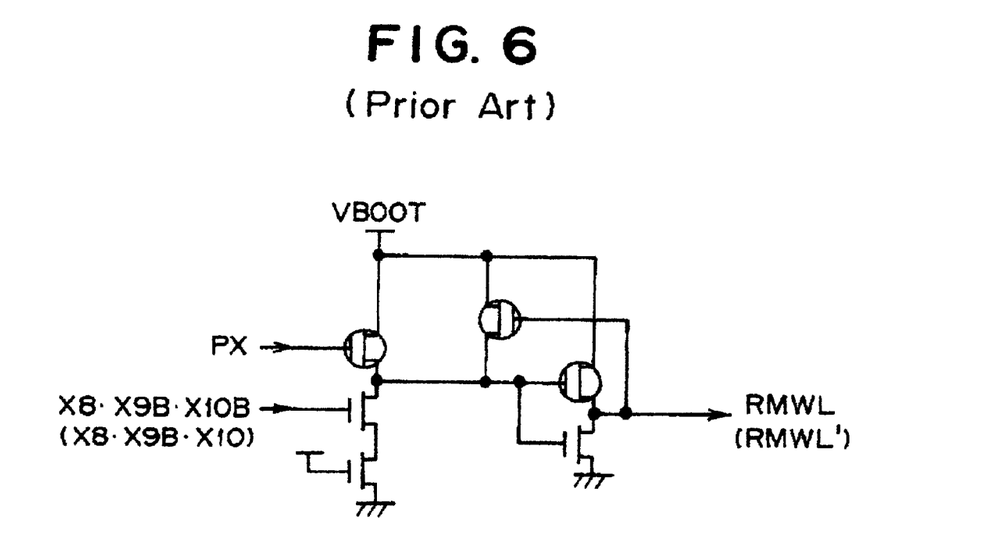
FIG. 6 is a circuit diagram showing a constructional example of the main word driver for redundancy in the semiconductor memory device of FIG. 4.

Each main word driver 2 and the main word driver for redundancy 3 are adjacent to each other and are arranged in the column direction for every memory array 1. As respectively illustrated in FIGS. 5 and 6, a main word driver control signal PX and internal X-address signals X2B.X3B.X4B, X2.X3B.X4B, X5B.X6B.X7B, X8.X9B.X10B, X8.X9B.X10 corresponding to first row address signal groups X2 to X10 of an input address signal are inputted and decoded. For example, respective main word signals MWL0 to MWLn and a main word line RMWL for redundancy for performing selective controls of respective word lines and a word line for redundancy are outputted to an upper side memory array of FIG. 4. Respective main word signals MWL0' to MWLn' and a main word signal RMWL' for redundancy for performing the selective controls of the respective word lines and the word line for redundancy are outputted to a lower side memory array of FIG. 4. Further, these main word drivers and the main word driver for redundancy are outputted with an internal raising voltage VBOOT as a high level.

Figure 7:
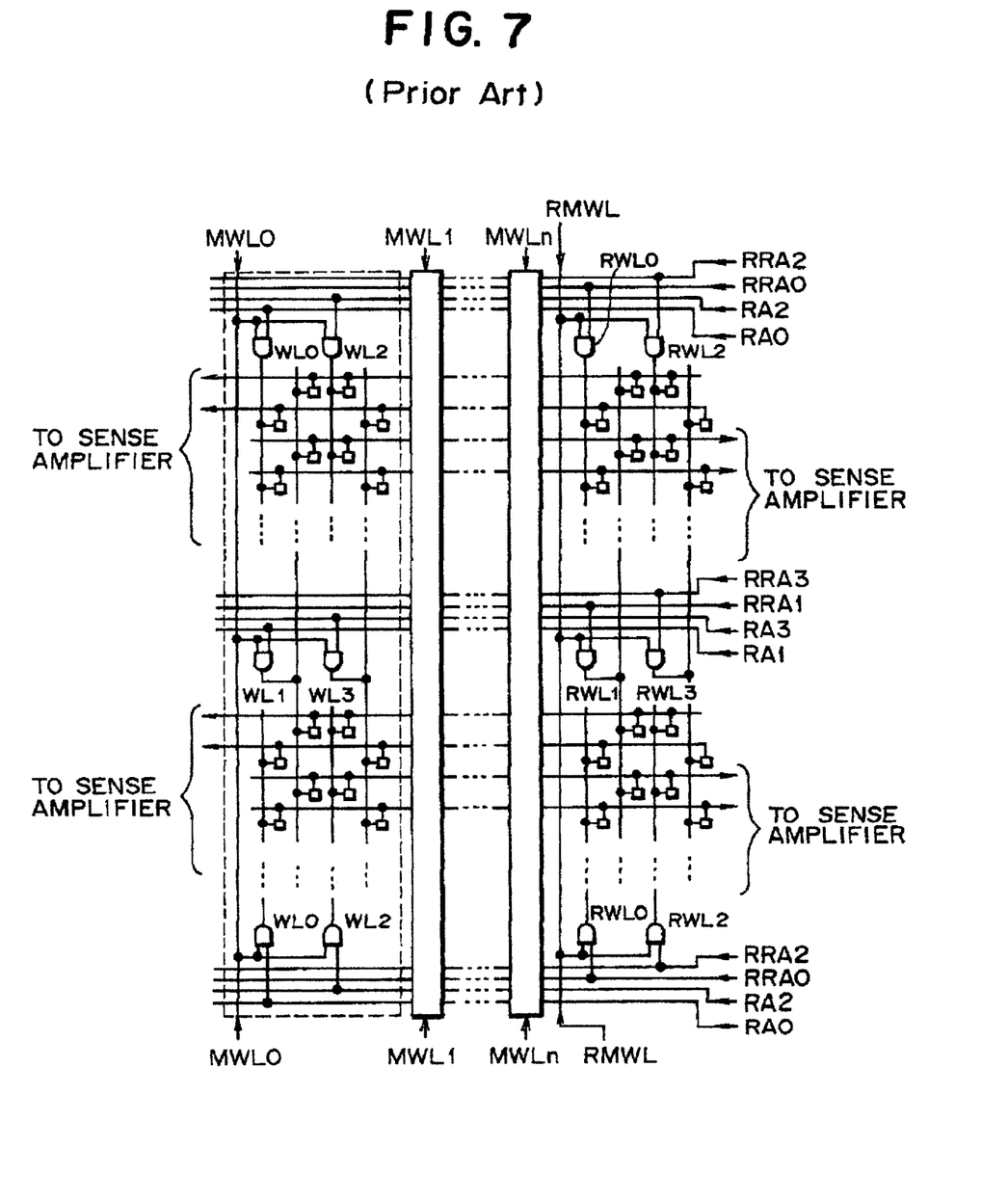
FIG. 7 is a block diagram showing a constructional example of a memory array in the semiconductor memory device of FIG. 4.

Each memory array 1 has a cell array constructed by memory cells arranged in the row and column directions and including a memory cell for redundancy. Each memory array also has sub word drivers and a sub word driver for redundancy for selecting the respective word lines and the word line for redundancy in this cell array. The cell array, the sub word drivers and the sub word driver for redundancy are divisionally dispersed. For example, FIG. 7 is a block diagram showing a constructional example of the upper side memory array of FIG. 4. The respective sub word drivers and the sub word driver for redundancy input and decode control signals RA0 to RA3, RRA0 to RRA3, the respective main word signals MWL0 to MWLn and the main word signal RMWL for redundancy from the divisional driver control circuit. The respective sub word drivers and the sub word driver for redundancy respectively output word line signals WL0 to WL3 with respect to each of the main word signals MWL0 to MWLn, and output each of word line signals RWL0 to RWL3 for redundancy with respect to the main word signal RMWL for redundancy. At this time, one of each word line of the cell array and each word line for redundancy is selected and operated. Further, these sub word drivers and the sub word driver for redundancy are operated with the internal raising voltage VBOOT.

Figure 8:
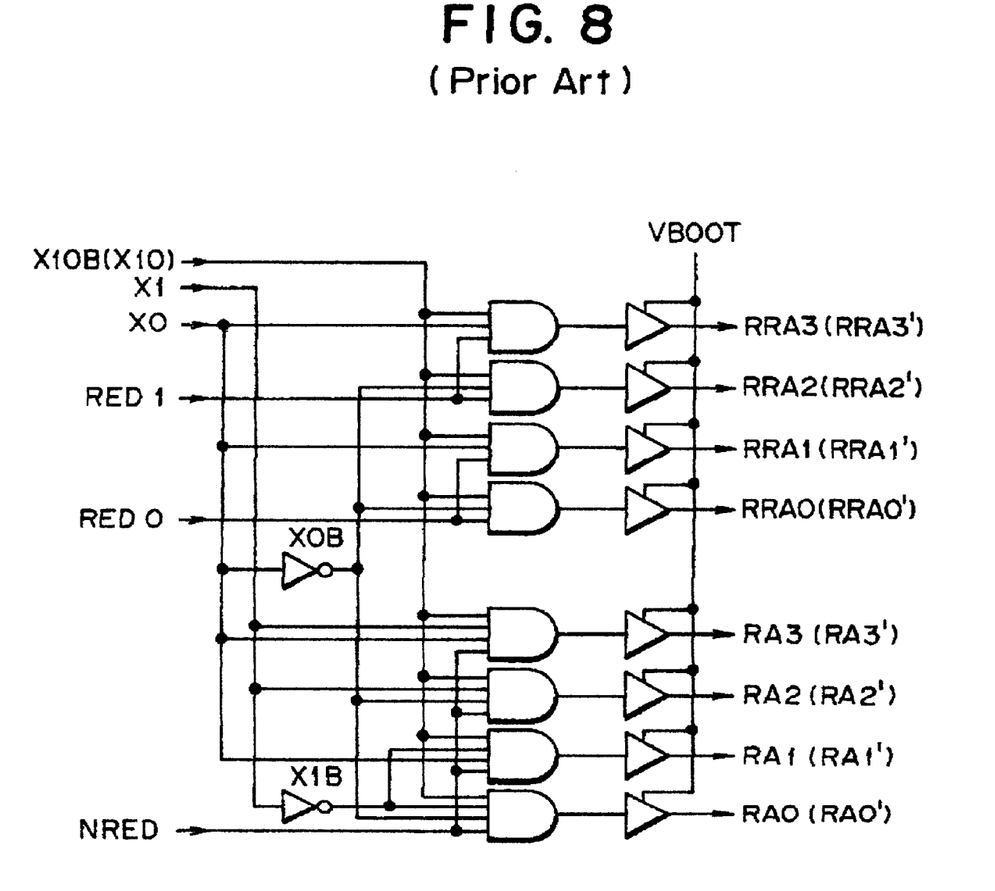
FIG. 8 is a circuit diagram showing a constructional example of a divisional driver control circuit in the semiconductor memory device of FIG. 4.

The divisional driver control circuit 4 is arranged in each column of each memory array and inputs and decodes second row address signal groups X0, X1, X10 of the input address signal and redundancy signals RED0, RED1, NRED. The divisional driver control circuit outputs control signals for controlling operations of each sub word driver and the sub word driver for redundancy within the memory array in each column. For example, FIG. 8 is a circuit diagram showing a constructional example of the divisional driver control circuit of FIG. 4. This divisional driver control circuit outputs control signals RRA0 to RRA3 on the basis of redundancy signals RED0, RED1 and outputs control signals RA0 to RA3 on the basis of the redundancy signal NRED. Each of the redundancy signals RED0, RED1 is a signal showing the selection of a redundancy address. The redundancy signal NRED is a signal showing that it is not a redundancy address. Therefore, the respective word line signals WL0 to WL3 and the word line signals RWL0 to RWL3 for redundancy within each memory array are not simultaneously selected and activated. Further, this divisional driver control circuit outputs the internal raising voltage VBOOT as a high level.

Each sense amplifier 5 is arranged between rows of the respective memory arrays and is connected between each bit line within an adjacent memory array 1 and a data input output line IO or IO'. Each sense amplifier 5 is selected, activated and controlled in accordance with a column address signal group of the input address signal. Each sense amplifier 5 amplifies, inputs and outputs each bit line data of the memory array 1.

A data amplifier 6 is arranged with respect to a pair of upper and lower each memory arrays 1 and is connected between the data input output line IO or IO' and a data bus line RWBS. Each data amplifier 6 is selected, activated and controlled in accordance with a data amplifier control signal DAE and internal X-address signals X8B.X9B, X8.X9B, X8B.X9, X8.X9 corresponding to first row address signals groups X8 to X9 of the input address signal. Each data amplifier amplifies, inputs and outputs data of the pair of upper and lower memory arrays.

This conventional semiconductor memory device is activated by a clock signal and an address signal provided from the exterior of this memory device and a specific memory cell is selected and the data are read/written. For example, the next explanation relates to an operation performed in a case in which internal X-address signals X0B, X1B, X2B.X3B.X4B, X5B.X6B.X7B, X8.X9B.X10B, X8.X9B, X10B corresponding to a row address signal of the input address signal are activated and its address signal does not show a redundancy address.

First, a main word driver control signal PX is set to a have a "high" voltage in accordance with the clock signal and the address signal so that a main word signal MWL0 and a main word signal RMWL for redundancy are activated. However, the redundancy signal NRED showing that it is not a redundancy address is active. The redundancy signals RED0, RED1 each showing a selection of the redundancy address are inactive. Accordingly, only a control signal RA0 is selected and activated and the other control signals RA1 to RA3, RRA0 to RRA3 are inactivate as they are. Accordingly, only a word line signal WL0 is selected and activated. The data of a memory cell inputting this word line signal WL0 thereto are outputted to a bit line. In a sense amplifier selected, activated and controller by an internal Y-address signal corresponding to a column address signal group of the input address signal, each bit line data are amplified, inputted and outputted between this sense amplifier and the data input output line IO or IO', Further, data are inputted and outputted to the exterior through each selected, activated and controlled data amplifier and a data bus line RWBS.

At this time, each data amplifier 6 is selected, activated and controlled in accordance with a data amplifier control signal DAE and internal X-address signals X8B.X9B, X8.X9B, X8B.X9, X8.X9 transmitted separately from internal X-address signals X8.X9B.X10B, etc. inputted to the main word drivers. Each data amplifier amplifies, inputs and outputs data to the exterior between this data amplifier and the data bus line RWBS.

The next explanation relates to an operation performed in a case in which internal X-address signals X0, X1B, X2B.X3B.X4B, X5B.X6B.X7B, X8.X9B.X10B, X8.X9B, X10B corresponding to a row address signal of the input address signal are activated and its address signal shows a redundancy address.

Also, in this case, a main word driver control signal PX is similarly set to have a "high" voltage in accordance with a clock signal and an address signal, and a main word signal MWL0 and a main word signal RMWL for redundancy are activated. However, the redundancy signal RED0 showing the selection of a redundancy address is active and the other redundancy signals RED1, NRED are inactive. Accordingly, only a control signal RRA1 is selected and activated and the other control signals RRA0, RRA2 to RRA3, RA0 to RA3 are inactive as they are. Therefore, only a word line signal RWL1 for redundancy is selected and activated. The data of a memory cell inputting this word line signal RWL1 for redundancy thereto are outputted to a bit line. Thereafter, similar to normal access, data are inputted and outputted to the exterior through the sense amplifier, the data amplifier, etc.

However, in the conventional semiconductor memory device, it is necessary to separately arrange wiring of the internal X-address signals corresponding to the row address signal of the input address signal with respect to a circuit such as the data amplifier unable to be arranged such that this circuit is adjacent to each main word driver and the main word driver for redundancy. Accordingly, a problem exists in that a layout area of the wiring of these internal X-address signals is large.

This is because it is difficult to pass the wiring through a memory array arranged between each main word driver, the main word driver for redundancy, and a circuit such as the data amplifier, etc.

SUMMARY OF THE INVENTION

Accordingly, an object of the present invention is to reduce the layout area of a semiconductor memory device in a divisional word driver system.

A semiconductor memory device according to the present invention comprised a plurality of blocks constituting of memory arrays arranged in a column direction, said blocks being arranged in row and column directions. A main word driver and a main word driver for redundancy respectively output a main word signal and a main word signal for redundancy for selectively controlling operations of each word line and each word line for redundancy of a memory array in accordance with a first row address signal group of an input address signal. A sub word driver and a sub word driver for redundancy select and operate one of said each word line and said each word line for redundancy by a control signal corresponding to a redundancy signal and a second row address signal group of said input address signal, said main word signal and said main word signal for redundancy. A block selecting circuit input an output of said main word driver for redundancy within said each block and output a block selecting signal showing selecting activation in a block unit.

In the semiconductor memory device of a divisional word driver system in the present invention, an output of the main word driver for redundancy within each block is outputted as a selective activating signal of the sub word driver for redundancy divisionally dispersed and arranged within the memory arrays. Further, a signal level of this output is shifted and is also used as a block selecting signal for selecting and activating each circuit in the block unit through the memory arrays. Therefore, it is not necessary to make the layout of an internal address signal wiring corresponding to the input address signal to select and activate each circuit such as a data amplifier, etc. constructed in the block unit so that a layout area of the semiconductor memory device is reduced.

DESCRIPTION OF THE PREFERRED EMBODIMENTS

Figure 1:
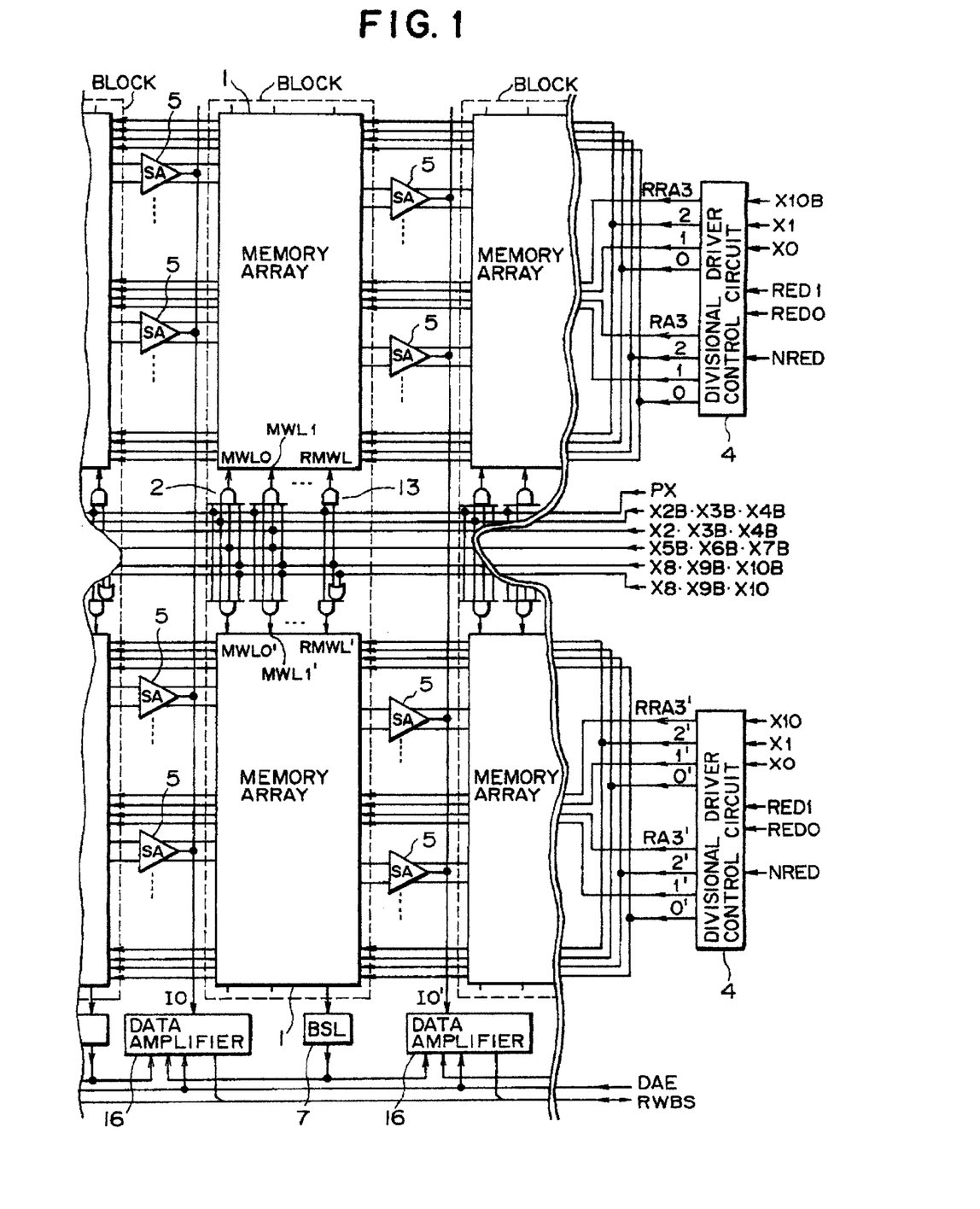
FIG. 1 is a partial block diagram showing an embodiment of a semiconductor memory device of the present invention.

The present invention will next be described with reference to the drawings. FIG. 1 is a partial block diagram showing an embodiment of a semiconductor memory device of the present invention.

Similar to the conventional semiconductor memory device of FIG. 4, in the semiconductor memory device in this embodiment, a main word driver 2, a main word driver for redundancy 13 and a memory array 1 are adjacent to each other and are arranged in a column direction. Plural pairs of these are arranged in row and column directions and a block is constructed with plural memory arrays 1 arranged in the column direction as a unit. A divisional driver control circuit 4 is arranged in each row of memory arrays 1. A sense amplifier 5 is arranged between columns of the memory arrays 1. A data amplifier 16 is arranged with respect to each block. This semiconductor memory device differs from the conventional semiconductor memory device shown in FIG. 4 in that a main word signal RMWL' for redundancy as one output of the main word driver for redundancy 13 within each block is also used as a block selecting signal showing selective activation in a block unit and input to a block selecting circuit (BSL) 7. The construction except for the main word driver for redundancy 13, the block selecting circuit (BSL) 7 and the data amplifier 16 is similar to that in the conventional semiconductor memory device of FIG. 4. Accordingly, an overlapping explanation of this construction is omitted in the following description.

Figure 2:
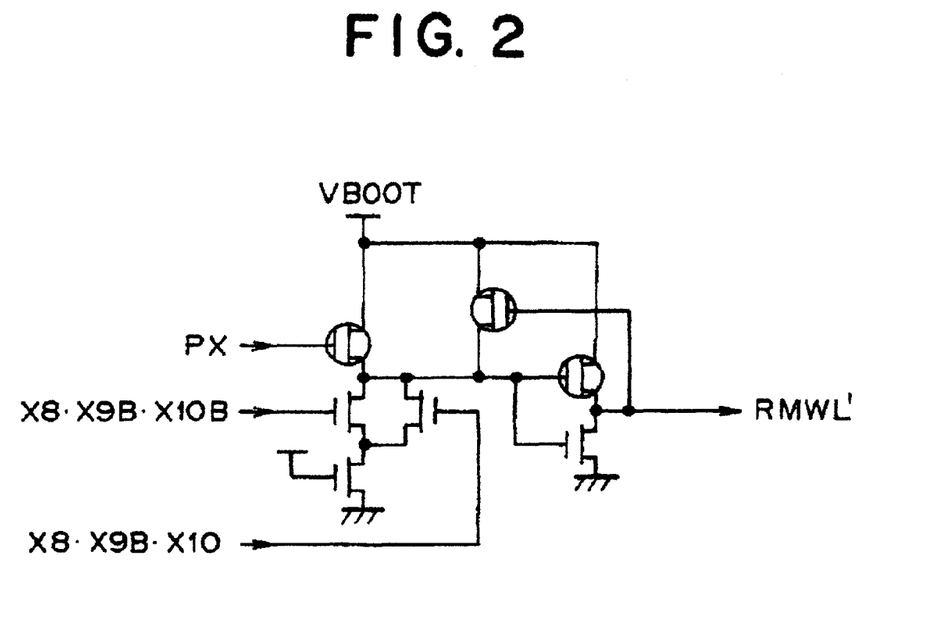
FIG. 2 is a circuit diagram showing a constructional example of a main word driver for redundancy for outputting a main word signal RMWL' for redundancy in the semiconductor memory device of FIG. 1.

In the main word driver for redundancy 13, different from the conventional semiconductor memory device of FIG. 4, one main word driver for redundancy within the block outputs the main word signal RMWL' for redundancy also used as a block selecting signal showing selecting activation in the block unit through the block selecting circuit BSL. FIG. 2 is a circuit diagram showing a constructional example of the main word driver for redundancy for outputting this main word signal RMWL' for redundancy. This main word driver for redundancy is a driver circuit for inputting a logical OR of internal X-address signals X8.X9B.X10B abd X8.X9B.X10 and outputs the main word signal RMWL' for redundancy in accordance with internal X-address signal X8.X9B.

Figure 3:
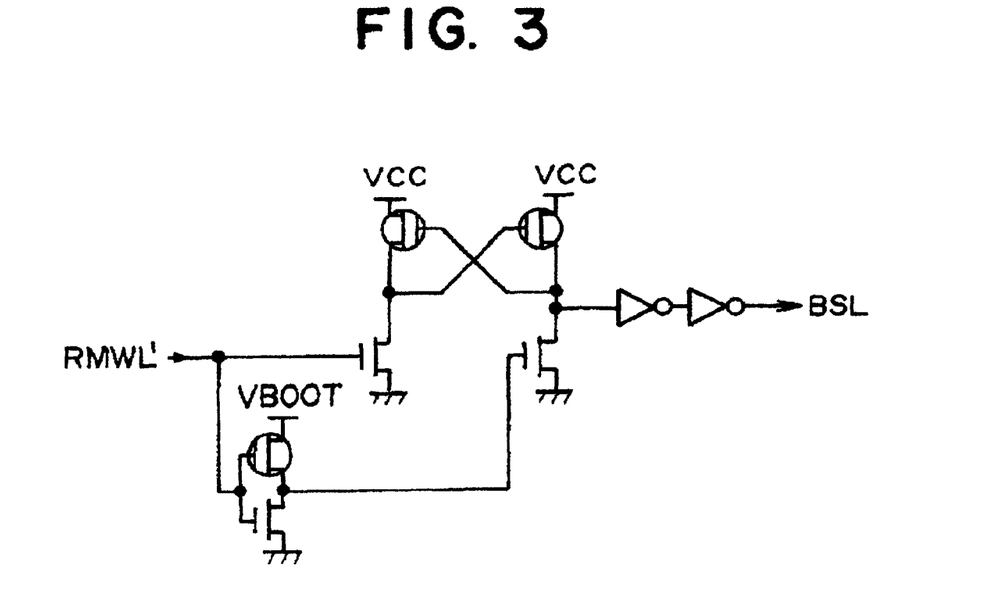
FIG. 3 is a circuit diagram showing a level shifter of a block selecting circuit (BSL) in the semiconductor memory device of FIG. 1.

FIG. 3 shows a circuit diagram of a level shifter of the block selecting circuit (BSL) 7. The block selecting circuit (BSL) 7 is constructed by a level shifter for shifting a signal level. The block selecting circuit BSL inputs the main word signal RMWL' for redundancy with an internal raising voltage VBOOT as a high level and outputs a block selecting signal with a power voltage as a high level.

Each data amplifier is connected between plural data input output lines for respectively inputting and outputting data in the block unit in a column direction and a data bus line for inputting and outputting data at all addresses in a row direction. The data amplifier is selected and activated in accordance with each block selecting signal and amplifies, inputs and outputs data.

An operation of the semiconductor memory device in this embodiment will next be explained as an operating example similar to the conventional one. Namely, the next explanation relates to an operation performed in a case in which internal X-address signals X0B, X1B, X2B.X3B.X4B, X5B.X6B.X7B, X8.X9B.X10B, X8.X9B, X10B corresponding to the row address signal of an input address signal are activated and its address signal does not show a redundancy address.

First, a main word driver control signal PX is set to have a have a "high" voltage in accordance with a clock signal and an address signal so that a main word signal WML0 and a main word signal RMWL for redundancy are activated with respect to an upper side memory array within a block. However, a redundancy signal NRED showing that it is not a redundancy address is active. Redundancy signals RED0, RED1 each showing a selection of the redundancy address are inactive. Accordingly, only a control signal RA0 is selected and activated and the other control signals RA1 to RA3, RRA0 to RRA3 are inactive as they are. Accordingly, only a word line signal WL0 is selected and activated. At this time, the main word signal RMWL' for redundancy is simultaneously activated with respect to a lower side memory array within the block, but control signals RA0' to RA3', RRA0' to RRA3' are inactive by the internal X-address signal X10 as they are. A sub word driver and a sub word driver for redundancy are not activated.

Accordingly, the data of a memory cell for inputting only a word line signal WL0 selected within the block are outputted to a bit line. In a sense amplifier selected, activated and controlled by an internal Y-address signal corresponding to a column address signal group of the input address signal, each bit line data are amplified, inputted and outputted between this sense amplifier and a data input output line IO or IO', and data are further inputted and outputted to the exterior through each selected, activated and controlled data amplifier and a data bus line RWBS.

At this time, each data amplifier is selected, activated and controlled in accordance with a block selecting signal and a data amplifier control signal DAE outputted from the block selecting circuit BSL by the main word signal RMWL' for redundancy simultaneously activated with respect to the lower side memory array within the block. Further, data are amplified, inputted and outputted to the exterior between each data amplifier and the data bus line RWBS.

On the other hand, the next explanation relates to an operation performed in a case in which internal X-address signals X0, X1B, X2B.X3B.X4B, X5B.X6B.X7B, X8.X9B.X10B, X8.X9B, X10B corresponding to a row address signal of the input address signal are activated and its address signal shows a redundancy address.

In this case, a main word driver control signal PX is similarly set to have a "high" voltage in accordance with a clock signal and an address signal, and a main word signal MWL0 and a main word signal RMWL for redundancy are activated with respect to an upper side memory array within a block. However, a redundancy address signal RED0 showing the selection of a redundancy address is active and the other redundancy signals RED1, NRED are inactive. Accordingly, only a control signal RRA1 is selected and activated and the other control signals RRA0, RRA2 to RRA3, RA0 to RA3 are inactive as they are. Therefore, only a word line signal RWL1 for redundancy is selected and activated. At this time, a main word signal RMWL' for redundancy is simultaneously activated with respect to a lower side memory array within the block, but control signals RA0' to RA3', RRA0' to RRA3' are inactive by the internal X-address signal X10 as they are. Therefore, the sub word driver and the sub word driver for redundancy are not activated.

Accordingly, the data of a memory cell for inputting an only word line signal RWL0 for redundancy selected within the block are outputted to a bit line. Thereafter, similar to normal access, data are inputted and outputted to the exterior through the sense amplifier, the data amplifier, etc.

What is claimed is:

1. A semiconductor memory device comprising:
   a plurality of blocks including memory arrays arranged in a column direction, said blocks being arranged in row and column directions;
   a main word driver and a main word driver for redundancy for respectively outputting a main word signal and a main word signal for redundancy for selectively controlling operations of each word line and each word line for redundancy of a memory array in accordance with a first row address signal group of an input address signal;

a sub word driver and a sub word driver for redundancy for selecting and operating one of said each word line and said each word line for redundancy by a control signal corresponding to a redundancy signal and a second row address signal group of said input address signal, said main word signal and said main word signal for redundancy; and a block selecting circuit that receives the main word signal for redundancy output from said main word driver for redundancy within said each block and outputs a block selecting signal showing selecting activation of the block.

2. The semiconductor memory device according to claim 1 further comprising:

a plurality of data input output lines arranged between said blocks in row and respectively connected to bit lines of said each memory array and respectively inputting and outputting data in the block unit in the column direction through a sense amplifier selected and activated in accordance with a column address signal group of said input address signal; and a plurality of data amplifiers each connected between said each data input output line and a data bus line for inputting and outputting data at all addresses in the row direction and selected and activated in accordance with said each block selecting signal and amplifying, inputting and outputting data.

3. The semiconductor memory device according to claim 1, wherein said block selecting circuit comprises a level shifter for shifting a signal level of said output of said main word driver for redundancy.

4. A memory device comprising:

a plurality of blocks including memory arrays arranged in a column direction, said blocks being arranged in row and column directions;

a main word driver and a main word driver for redundancy for respectively outputting a main word signal and a main word signal for redundancy for selectively controlling operations of each word line and each word line for redundancy of a memory array based on an input address signal; and a block selecting circuit that receives the main word signal for redundancy output from said main word driver for redundancy within said each block and outputs a block selecting signal showing selecting activation of the block.

5. The memory device according to claim 4, further comprising a sub word driver and a sub word driver for redundancy for selecting and operating one of said each word line and said each word line for redundancy by a control signal corresponding to a redundancy signal and an input address signal.

6. The memory device according to claim 4, further comprising a plurality of data input output lines arranged between said blocks in a row direction and respectively connected to bit lines of said each memory array and respectively inputting and outputting data in the block in the column direction through a sense amplifier selected and activated in accordance with a column address signal group of said input address signal.

7. The memory device according to claim 6, further comprising a plurality of data amplifiers each connected between said each data input output line and a data bus line for inputting and outputting data at all addresses in the row direction and selected and activated in accordance with said each block selecting signal and amplifying, inputting and outputting data.

8. The memory device of claim 4, wherein said block selecting circuit comprises a level shifter for shifting a signal level of said output signal of said main word driver for redundancy.

* * * * *

UNITED STATES PATENT AND TRADEMARK OFFICE
CERTIFICATE OF CORRECTION

PATENT NO. : 6,009,035
DATED : December 28, 1999
INVENTOR(S) : Akihiko KAGAMI

It is certified that error appears in the above-identified patent and that said Letters Patent is hereby corrected as shown below:

On the cover page, section 75, change "Akiihiko" to --Akihiko--.

Signed and Sealed this

First Day of August, 2000

Attest:

Q. TODD DICKINSON

Attesting Officer

Director of Patents and Trademarks